US009908358B2

(12) United States Patent
Van Brakel et al.

(10) Patent No.: US 9,908,358 B2
(45) Date of Patent: Mar. 6, 2018

(54) PATTERNED STAMP MANUFACTURING METHOD, PATTERNED STAMP IMPRINTING METHOD AND IMPRINTED ARTICLE (71) Applicant: KONINKLIJKE PHILIPS N.V., Eindhoven (NL)

(72) Inventors: Remco Van Brakel, Breda (NL); Marcus Antonius Verschuuren, Jr., Brekel-Enschot (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 30 days.

(21) Appl. No.: 14/905,856

(22) PCT Filed: Jul. 22, 2014

(86) PCT No.: PCT/EP2014/065656
§ 371 (c)(1),
(2) Date: Jan. 18, 2016

(87) PCT Pub. No.: WO2015/011110
PCT Pub. Date: Jan. 29, 2015

(65) Prior Publication Data
US 2016/0152064 A1 Jun. 2, 2016

(30) Foreign Application Priority Data

Jul. 22, 2013 (EP) ..................................... 13177413

(51) Int. Cl.
B41N 1/14 (2006.01)
B41K 1/28 (2006.01)
(Continued)

(52) U.S. Cl.
CPC .................. B41N 1/14 (2013.01); B41C 3/04 (2013.01); B41F 7/00 (2013.01); B41K 1/26 (2013.01); B41K 1/28 (2013.01); G03F 7/0002 (2013.01)

(58) Field of Classification Search
CPC ........... G03F 7/0002; B41N 1/14; B41C 3/04; B41K 1/26; B41K 1/28
See application file for complete search history.

(56) References Cited

U.S. PATENT DOCUMENTS 2,994,266 A 8/1961 Sparrow
2004/0001259 A1 1/2004 Ohtsu
(Continued)

FOREIGN PATENT DOCUMENTS

DE 19819463 B4 3/2004
WO WO2009147602 A2 12/2009

OTHER PUBLICATIONS

Farshchian B. et al., "Soft UV-Nanoimprint Lithography on Non-Planar Surfaces", Microelectronic Engineering, Elsevier Publishers BV., Amsterdam, NL, vol. 88, No. 11, Jul. 20, 2011 (Jul. 20, 2011), pp. 3287-3292, XP028109521.
(Continued)

Primary Examiner — Alison L Hindenlang
Assistant Examiner — Michael Robinson
(74) Attorney, Agent, or Firm — Larry Liberchuk (57) ABSTRACT A method of manufacturing a patterned stamp (100) for patterning a contoured surface (10) is disclosed. The method comprises providing a pliable stamp layer (120) carrying a pattern of features (122), forcing the pliable stamp layer onto the contoured surface with said pattern of features facing the contoured surface; applying a fluid support layer (130) over the pliable stamp layer on the contoured surface; solidifying the support layer (140) to form the patterned stamp; and
(Continued)

removing the patterned stamp from the contoured surface. A corresponding patterned stamp, imprinting method and imprinted article are also disclosed.

9 Claims, 7 Drawing Sheets

(51) Int. Cl.
  *B41K 1/26* (2006.01)
  *G03F 7/00* (2006.01)
  *B41C 3/04* (2006.01)
  *B41F 7/00* (2006.01)

(56) References Cited

U.S. PATENT DOCUMENTS

| | | |
|---|---|---|
| 2008/0011934 A1 | 1/2008 | Verschuuren |
| 2008/0202673 A1 | 8/2008 | Forrest |
| 2009/0004320 A1 | 1/2009 | Ohashi |
| 2009/0025595 A1 | 1/2009 | Mayers |
| 2010/0109203 A1 | 5/2010 | Chen |
| 2011/0094403 A1* | 4/2011 | Verschuuren ............ B41N 1/12 101/450.1 |

OTHER PUBLICATIONS

Cheng Fang-Sung et al., "Soft Mold and Gasbag Pressure Mechanism for Patterning Submicron Patterns onto a Large Concave Substrate", Journal of Vacuum Science and Technology: Part B, AVS / AIP, Melville, New York, NY, US, vol. 24, No. 4, Jun. 28, 2006 (Jun. 28, 2006), pp. 1724-1727, XP012091566.

Moormann C. et al., "Liquid Transfer Nanoimprint Replication on Non-Flat Surfaces for Optical Applications", Microelectronic Engineering 100, pp. 28-32, 2012.

Shin Ju-Hyeon et al., "Fabrication of Flexible UV Nanoimprint Mold with Fluorinated Polymer-Coated PET Film", Nanoscale Research Letters 2011, 6:458, pp. 1-5, 2011.

Tseng Shih-Chun et al., "Electron Beam Lithography on Cylindrical Roller", Microelectronic Engineering 87, pp. 943-946, 2010, Nano Technology Research Center, Industrial Technology Research Institute, Hsinchu 300, Taiwan, ROC, Mechanical and Systems Research Laboratories, Industrial Technology Research Institute, 300, Taiwan, ROC, Department of Materials Science and Engineering, National Chiao Tung University, 300, Taiwan, ROC.

Lee, Dongkeon et al., "3D Replication Using PDMS Mold for Microcoil", Microelectronic Engineering, 86, pp. 920-924, 2009, a Core Research for Evolutional Science and Technology (CREST), Japan Science and Technology Agency (JST), Japan, Advanced Manufacturing Research Institute (AMRI), National Institute of Advanced Industrial Science and Technology (AIST).

Traut S. et al., "Holographically Recorded Gratings on Microlenses for a Miniaturized Spectrometer Array", Institute of Microtechnology, Neuchatel, Switzerland © 2000 Society of Photo-Optical Instrumentation Engineers, Opt. Eng., vol. 39, No. 1, pp. 290-298, Jan. 2000 Downloaded From: http://opticalengineering.spiedigitallibrary.org/ on Jan. 13, 2016 Terms of Use: http://spiedigitallibrary.org/ss/TermsOfUse.aspx.

* cited by examiner

PATTERNED STAMP MANUFACTURING METHOD, PATTERNED STAMP IMPRINTING METHOD AND IMPRINTED ARTICLE

FIELD OF THE INVENTION

The present invention relates to a method of manufacturing a patterned stamp for patterning a contoured surface.

The present invention further relates to such a patterned stamp.

The present invention yet further relates to a method of patterning a contoured surface using such a stamp.

The present invention yet further relates to an article obtained from this patterning method.

BACKGROUND OF THE INVENTION

Imprint lithography (IL) is a technique in which a patterned layer such as a masking layer is formed on a substrate such as a semiconductor substrate or as an optical layer by the deposition of a curable imprintable medium. The curable imprintable medium is subsequently patterned by imprinting the medium with a patterned stamp, after which the curable imprintable medium is solidified e.g. when exposed to light, e.g. UV-light to initiate the curing reaction in the medium. After the curing reaction is completed, the stamp is removed from the medium to leave a patterned layer, e.g. on the semiconductor substrate or on a carrier of such an optical layer.

This technique has recently drawn considerable attention because it can provide a significant cost reduction over traditional lithography process steps. A promising prospect of imprint lithography is that it can be used for forming nanoscale patterns on so-called 2.5D surfaces, i.e. contoured surfaces, which for instance may comprise one or more protrusions, e.g. curved protrusions, emanating from a mainly planar surface. Such techniques may be used to pattern photo-voltaic solar cells, nanowires, VECSEL lasers, medical implants and so on, e.g. by creating nanoscale patterns on optical elements, e.g. lenses or on medical implants, e.g. to stimulate bone or tissue regeneration. To this end, a planar pliable patterned stamp, such as a polysiloxane-based rubber-like stamp, is typically deformed onto the contoured surface such that the stamp pattern is brought into contact with the contoured surface to be patterned. An example of such a stamp is shown in US 2008/0011934 A1.

However, a practical problem remains that it is far from trivial to transfer a pattern from a flexible stamp to all of such a contoured surface. In particular, it is difficult to bring the stamp into contact with a boundary region between a planar section and a (curved) protrusion such that such regions can suffer from incomplete or even absent pattern features. This is because it is far from trivial to deform the pliable stamp to such an extent that it exactly matches the contoured surface. In addition, the high pressures required to force the stamp into these boundary regions reduces the lifetime of the stamp and requires more complicated IL device.

SUMMARY OF THE INVENTION

The present invention seeks to provide a method of manufacturing a patterned stamp for patterning a contoured surface in a more accurate manner.

The present invention further seeks to provide a patterned stamp for patterning a contoured surface in a more accurate manner.

The present invention further seeks to provide a method of patterning a contoured surface in a more accurate manner using such a stamp.

The present invention yet further seeks to provide an article comprising a more accurately patterned contoured surface.

The invention is defined by the independent claims. The dependent claims provide advantageous embodiments.

According to an aspect of the invention, there is provided a method of manufacturing a patterned stamp for patterning a contoured surface, By providing a thin pliable patterned stamp layer over the contoured surface to be patterned, the stamp layer can be brought into contact with every aspect of the contoured surface due to the fact that the bulk support of the stamp that gives the stamp its structural integrity is not yet present. Indeed, this structural integrity limits the pliability of a stamp having a pattern of features extending from a planar surface. Consequently, the absence of the structural integrity provided by the support layer ensures that a good contact between the pattern of features and the contoured surface can be achieved. The subsequent formation of the support layer on the stamp layer fixates the patterned surface of the stamp into a contoured stamp surface carrying a pattern of features that complements the contoured surface to be imprinted, thereby providing a patterned stamp suitable for use in the imprint lithography of such contoured surfaces.

In a preferred embodiment, the step of forcing the pliable stamp layer onto the contoured surface comprises placing the contoured surface with the pliable stamp layer in a vacuum chamber; and reducing the pressure in said vacuum chamber to force the pliable stamp layer onto the contoured surface. This ensures an even more intimate fit between the stamp layer and the contoured surface, thereby further improving the matching of the stamp to the contoured surface. Alternatively, the step of forcing the pliable stamp layer onto the contoured surface may comprise applying an overpressure to the pliable stamp layer to force the pliable stamp layer onto the contoured surface.

In an embodiment, the solidifying step comprises grafting the support layer onto the pliable stamp layer. This further improves the integration of the stamp layer into the support layer, thereby providing a stamp with excellent structural integrity. This may for instance be achieved if the stamp layer and the support layer comprise a rubbery curable material, such as a polysiloxane-based material. A particularly suitable polysiloxane-based material is polydimethylsiloxane (PDMS). The grafting may for instance take place during the curing of the rubbery material.

It is recognized that the features of the stamp layer may alter during the manufacturing of the stamp, such that the actual pattern of the stamp may deviate from its intended pattern. Several embodiments of the present method are directed to countering this mismatch.

In an embodiment, the features of the stamp layer have larger than intended dimensions, said features shrinking to the intended dimensions during said solidifying step.

In another embodiment, the method further comprises applying a soft layer onto the contoured surface, wherein the step of forcing the pliable stamp layer onto the contoured surface comprises forcing said features into the soft layer. Consequently, the soft layer provides structural support to the features, i.e. protects the features from deforming under the pressures applied to the stamp layer during the stamp manufacturing process. The soft layer may for instance be a resist layer, which may be undeveloped (i.e. uncured). The soft layer preferably is a liquid layer.

In yet another embodiment, the pliable stamp layer comprises a distorted pattern of features, and wherein the step of forcing the patterned pliable stamp layer onto the contoured surface comprises deforming the distorted pattern into an intended pattern. It is possible to predict the distortion of the features caused by the pressures applied to the stamp layer during the stamp manufacturing process. By applying the inverse distortion function to the intended pattern, a distorted pattern can be calculated that distorts under said pressures into the intended pattern. In this embodiment, care has to be taken that the deformed pattern is accurately aligned with the contoured surface to ensure that the intended pattern is created in the intended position on the contoured surface.

The method may further comprise fixating the final patterned stamp on a rigid carrier such as a glass carrier to give further structural integrity to the stamp and reduce the risk of stamp deformation in the X-Y plane (i.e. the plane of the major stamp surface receiving the carrier).

In accordance with another aspect of the present invention, there is provided a patterned stamp comprising a rubber body including a contoured surface carrying a pattern of relief features that complements a patterned contoured surface to be formed. Such a stamp may be obtained by the stamp manufacturing method of the present invention and provides an excellent fit with a contoured surface to be patterned.

In an embodiment, the contoured stamp surface carrying the pattern of features is defined by a first layer, the rubber body further comprising a support layer on the first layer, wherein the support layer is of a different material than the first layer. The first layer may be a rubber layer having a first Young's modulus and the support layer is a rubber layer having a second Young's modulus, wherein the first Young's modulus is larger than the second Young's modulus. This has the advantage that a stamp is provided that has excellent overall flexibility combined with an increased robustness against deformation of the features on the contoured surface of the stamp. Also flexibility of the final stamp can be adjusted using the modulus of the support layer, while the first layers modulus can be kept such that good contour coverage is obtained in the stamp manufacturing process.

The first layer and the second layer may be and preferably are respective PDMS layers.

In accordance with yet another aspect of the present invention, there is provided a method of forming a patterned contoured surface, This method yields a contoured surface with excellent pattern coverage. The receiving surface may be a contoured surface matching the contours of the stamp surface or may be a planar surface as due to the stamp being contoured, the final patterned surface will also comprise a contoured patterned surface.

The imprinting step may be performed under reduced pressure, e.g. vacuum, to further improve the contact between the patterned stamp and the contoured surface. In accordance with yet another aspect of the present invention there is provided an article comprising a patterned contoured surface obtained by the aforementioned method of forming a patterned contoured surface. Such an article is distinguished from prior art articles by a more complete pattern formation on its contoured surface.

The invention in all its aspects can be advantageously used in and for imprint lithography where pattern features are of the order of the wavelength of visible light. Due to flexibility of the stamp, the invention is particularly useful for imprint lithography using flexible stamp such as substrate conformal imprint lithography processes when the substrates are moderately or strongly contoured or need contured patterned surfaces (e.g. curved glass that needs a pattern).

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

It should be understood that the Figures are merely schematic and are not drawn to scale. It should also be understood that the same reference numerals are used throughout the Figures to indicate the same or similar parts.

Figure 1:
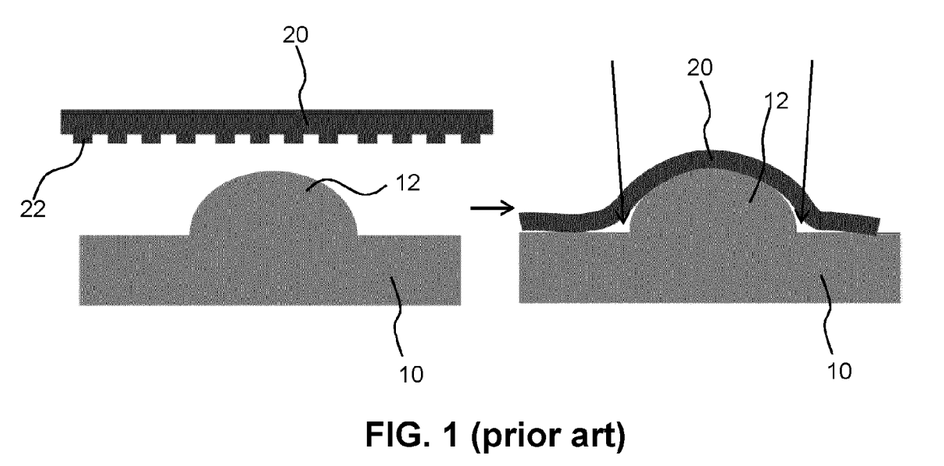
FIG. 1 schematically depicts a prior art imprinting process.

FIG. 1 schematically depicts a prior art lithographic printing process for printing a surface 10 comprising one or more contours 12. A rubber stamp 20 such as a PDMS stamp comprising a pattern of features 22 extending from a planar surface of the stamp 20 is brought into contact with the surface 10 comprising one or more contours 12 and coated with an imprintable layer, e.g. an undeveloped resist layer. This layer is not shown in FIG. 1 .The stamp 20 is placed on the surface 10 and deformed by exerting pressure on it such that the stamp 20 assumes the overall shape of the surface 10. The resist layer is subsequently developed after which the stamp 20 is removed from the surface 10 to leave behind a developed layer imprinted with the features 22.

However, a problem with this approach is that the planar stamp 20 can only be deformed by a limited amount, such that the boundary between a contour 12 and the remainder of the surface 10 cannot be contacted by the stamp 20, as indicated by the arrows in the right-hand pane of FIG. 1 (the features 22 are omitted in the right-hand pane for the sake of clarity). Consequently, a partially imprinted article is obtained, in which the pattern of features 22 is absent in these boundary regions. The size of the uncovered area can be reduced by increasing the pressure on the stamp 20 during the imprinting process, but this reduces the lifetime of the stamp 20 and increases the risk of deformation of the pattern of features 22 during the imprinting process, which reduces the quality of the transferred pattern on the surface 10.

This problem is addressed by at least some embodiments of the present invention in which a stamp is provided having a patterned surface with an overall shape that complements the surface 10 of the article to be patterned. This has the benefit that the stamp surface does not need to be deformed to be brought into contact with the surface 10 including the boundary region of the contour 12. Consequently, the stamp is capable of transferring its pattern of features to the whole of the surface 10 including the boundary regions of the one or more contours 12 on the surface 10.

Figure 2:
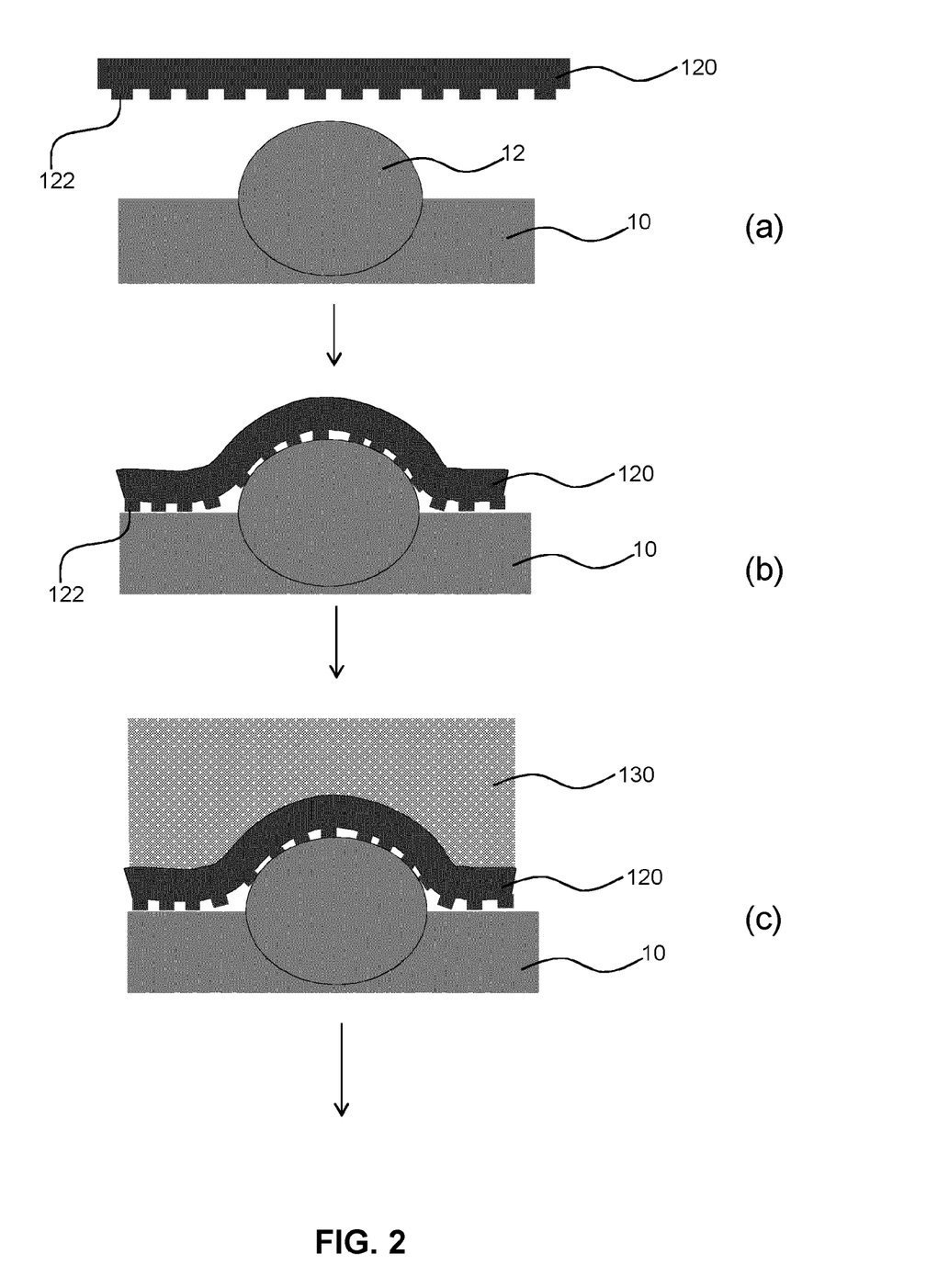
FIG. 2 schematically depicts a stamp manufacturing method according to an embodiment of the present invention.

FIG. 2 schematically depicts the various steps of a method according to an embodiment of the present invention for manufacturing a stamp for use in a soft lithography process, e.g. a nanoscale patterning process of contoured surfaces, as will be explained in more detail later.

The method commences in step (a) with the provision of a pliable stamp layer 120 carrying a pattern of features 122. The stamp layer 120 derives its pliability from the chosen stamp material and its thickness. In an embodiment, the stamp layer 120 is made of an elastomer or rubber-like material, such as a suitable block-copolymer, e.g. SEBS, or a polysiloxane-based rubber-like material. In an embodiment, the stamp layer 120 is made of a polysiloxane-based rubber-like material such as PDMS, a T-branched and/or a Q-branched polysiloxane-based rubber-like material as for instance disclosed in WO2009/147602 A2. It is noted for the avoidance of doubt that a T-branched polysiloxane comprises 3-way branching chains, i.e. networks, for instance when crosslinked by linear polysiloxanes. Likewise, a Q-branched polysiloxane comprises 4-way branching chains, i.e. networks, for instance when crosslinked by linear polysiloxanes. In yet another embodiment the stamp layer 120 is made of PDMS. It should however be understood that the stamp layer 120 may be made of any suitably pliable material.

The pliable stamp layer 120 should have a thickness that allows the stamp layer 120 to be pliable, i.e. to form an intimate contact with the boundary regions of the contours on the surface 10. It will be understood that the suitable thickness of the pliable stamp layer 120 will depend on the material chosen for the pliable stamp layer 120. The pliable stamp layer 120 typically will have a thickness of no more than a few mm, e.g. 1 mm or less to ensure that the stamp layer 120 has the desired pliability characteristics. In an embodiment, the pliable stamp layer 120 may be made of a rubbery material such as PDMS and/or may have a maximum thickness in the range of 100-1,000 micron, although it should be understood that the lower limit of this range may be further reduced, e.g. to 50 micron, 10 micron or even 1 micron at the cost of increased fragility of the pliable stamp layer 120. For the avoidance of doubt it is clarified that the thickness of the pliable stamp layer 120 is defined as the combination of the thickness of its bulk material and the height of the features 122.

The features 122 define a pattern to be transferred to a surface 10 comprising at least one contour 12. The features 122 may have a feature size ranging from several microns to a few nanometers, i.e. the features 122 may define a nano-pattern, although it is also feasible to use larger feature sizes. The pliable stamp layer 120 may have a Young's modulus that is tailored to the intended sizes of the features 122 of the stamp to be manufactured. For instance, for relatively large feature sizes, e.g. feature sizes of 500 nm up to several microns, e.g. 2 micron or 5 micron, a relatively soft rubbery material may be used, e.g. a rubbery material having a Young's modulus in the range of 2.5-5 MPa, such as a soft PDMS. This is because the relatively large sized features 122 are relatively insensitive to collapse due to surface tension during the stamp manufacturing process or an imprinting process. Such collapse is typically related to the inter-feature distance, with small inter-feature distances causing overly flexible features 122 to stick together. It is noted that the inter-feature distance is typically but not necessarily correlated to the feature size.

Hence, when smaller sizes of the features 122 (and/or smaller inter-feature distances) are required, more rigid rubbery materials may be contemplated to prevent collapse of the smaller size features 122 due to the aforementioned surface tension. In an embodiment where the dimensions of the stamp features 122 are in the range of 200 nm-2 micron, a rubbery material having a Young's modulus in the range of 7-11 MPa, such as a hard PDMS may be contemplated, whereas for a stamp having dimensions of the stamp features 122 in the range of 1 nm-2 micron, a rubbery material having a Young's modulus in the range of 40-80 MPa, such as an extra hard PDMS (sometimes referred to as X-PDMS) may be contemplated. For the avoidance of doubt it is noted that the reported Young's moduli have been determined by a standardized hardness test according to the ASTM D1415 -06(2012) standard by penetrating the rubber material with a rigid ball under the conditions mandated by the standard.

The pattern of features 122 may be formed in the pliable stamp layer 120 in any suitable manner. Known techniques such as electron beam etching or interference lithography may be used to form the pattern of features 122. The surface 10 comprising at least one contour 12 will also be referred to as the contoured surface 10. In an embodiment, the contoured surface 10 has a length ranging from a few microns to several cm. The stamp layer 120 may have a length matching the length of the contoured surface 120. The contoured surface 10 may be of any suitable material, e.g. glass, a suitable polymer, a metal, a semiconductor material such as Si, SiGe, AlGaN, and so on. The contoured surface 10 may form part of an article to be mass-produced, such that multiple copies or instances of the contoured surface 10 are to be imprinted. The contoured surface 10 as shown in FIG. 2 acts as a template for these multiple copies or instances of the contoured surface 10.

In step (b), the pliable stamp layer 120 is applied over the contoured surface 10 such that the pattern of features 122 is brought into contact with the contoured surface 10. Due to its limited thickness, the pliable stamp layer 120 can be brought into contact with the entire surface of the contoured surface 10, including the boundary region of the contours 12, i.e. the region in which the contoured surface 10 may comprise a discontinuity. In an embodiment, the pliable stamp layer 120 is applied over the contoured surface 10 under reduced pressure, as this further improves the intimate relationship between the features 122 and the contoured surface 10. In an alternative embodiment, the pliable stamp layer 120 is applied over the contoured surface 10 whilst applying an overpressure. The removal of the air or other gas from between the pliable stamp layer 120 and the contoured surface 10 ensures that the pliable stamp layer 120 adheres to the contoured surface 10, in particular in the aforementioned discontinuous surface regions of the contoured surface 10. Such a reduced pressure may for instance be achieved by placement of the contoured surface 10 and applied pliable stamp layer 120 in a vacuum chamber and applying a vacuum to the contoured surface 10 and applied pliable stamp layer 120. This will be explained in more detail later. An overpressure may instead be applied; it is known per se how an overpressure can be applied to a stamp layer on a surface such that this will not be explained in further detail for the sake of brevity.

As previously mentioned, the pattern of features 122 may deform during the application of the pliable stamp layer 120 on the contoured surface 10, e.g. when molding or stretching the pliable stamp layer 120 over the contoured surface 10 and/or when a relatively large pressure, e.g. vacuum pressure, is applied to the pliable stamp layer 120. Such deformations may typically occur when voids are present in between the features 122, as the (reduced) pressure will remove the medium, e.g. air, from these voids, which can lead to the deformation of the features 122.

In an embodiment, this problem is addressed in that pliable stamp layer 120 comprises a distorted pattern of features 122 such that during the application step (b) in which the patterned pliable stamp layer 120 is forced onto the contoured surface 10, the distorted pattern of features 122 deforms into the intended or desired pattern of features 122. The distorted pattern of features 122 may be empirically determined or may be calculated, e.g. using modelling software that can estimate the deformation of such features 122 under the applied pressures.

In an alternative embodiment, this problem is addressed by applying a soft layer such as an undeveloped resist precursor layer or another suitable liquid layer, e.g. an uncured material composition, onto the contoured surface 10, such that the features 122 are pressed into this soft layer during application step (b). More specifically, the medium in the voids in between the features 122 is replaced by the soft layer material, e.g. the resist material, such that the soft layer material in these voids provides structural support to the features 122, thereby preventing significant distortion of the features 122. This therefore may obviate the need to provide the patterned pliable stamp layer 120 with a distorted pattern of features 122 as the pattern does not significantly deform during the application step (b). As such, this embodiment may provide a more cost-effective solution to the deformation problem.

The method subsequently proceeds to step (c) in which a precursor material 130 for forming a support layer on the pliable stamp layer 120 is deposited on the pliable stamp layer 120. In case step (b) is performed under reduced pressure, step (c), i.e., the deposition of the precursor material 130 on the pliable stamp layer 120 may also be performed under reduced pressure, e.g. by providing a small opening in the vacuum chamber that provides access to the top of the pliable stamp layer 120 for the fluid or liquid precursor material 130 to be poured onto the pliable stamp layer 120 whilst maintaining a reduced pressure in the vacuum chamber to preserve the match between the pliable stamp layer 120 and the contoured surface 10. The precursor material 130 typically is a fluid material, e.g. a liquid such as a viscous liquid or gel, such that the precursor material 130 readily matches the surface profile of the pliable stamp layer 120. Although not specifically shown in step (c), the contoured surface 10 and applied pliable stamp layer 120 may be placed in a suitable container to prevent the fluid precursor material 130 from spilling beyond the boundaries of the contoured surface 10.

The precursor material 130 preferably is a composition for forming a rubber-like support layer on the pliable stamp layer 120. The rubber-like support layer preferably has similar or identical thermal expansion coefficients as the pliable stamp layer 120. This may for instance be achieved by the pliable stamp layer 120 and the rubber-like support layer having the same material composition.

In an embodiment, the precursor material 130 is a composition for forming a PDMS having a Young's modulus of 2.5-5 MPa, i.e. a soft PDMS. The soft PDMS rubber-like support layer may be combined with any of the aforementioned PDMS pliable stamp layers 120, i.e. with a PDMS pliable stamp layer 120 having the same or a higher Young's modulus.

The thickness of the precursor material layer 130 is such that upon solidification of the precursor material layer 130 to form the rubber-like support layer on the pliable stamp layer 120, the resulting stamp has good structural integrity, such that the surface of the pliable stamp layer 120 carrying the pattern of features 122 does not readily deform. In other words, the rubber-like support layer fixates the shape of the contoured surface 10 in the surface of the pliable stamp layer 120 carrying the pattern of features 122.

Next, the precursor material layer 130 is solidified in step (d) to form the rubber-like support layer 140. The solidification process may for instance be achieved by a curing process catalyzed by UV radiation, heat, radicals and combinations thereof. In an embodiment, the solidification step is also performed under reduced pressure, i.e. inside the vacuum chamber. During the solidification process, e.g. through curing, the chemical reactions in the precursor material layer 130 may cause the grafting of the rubber-like support layer 140 onto the pliable stamp layer 120, thereby ensuring a strong bond between the rubber-like support layer 140 and the pliable stamp layer 120. It will be understood that other suitable types of bonding may also be contemplated; e.g. adhesion by the use of an adhesive on the pliable stamp layer 120, and so on. Such an adhesive may for instance be applied after formation of the rubber-like support layer 140, after which the rubber-like support layer 140 may be temporarily lifted from the pliable stamp layer 120 to apply the adhesive to the pliable stamp layer 120 or to the surface of the rubber-like support layer 140 to be in contact with the pliable stamp layer 120 after which the rubber-like support layer 140 may be placed again on the pliable stamp layer 120.

At this point it is noted that the solidification of the precursor material layer 130 may cause some shrinkage of the features 122 of the pliable stamp layer 120, particularly in the height direction, i.e. the direction perpendicular to the contoured surface 10, especially when the solidification process is performed at elevated temperatures. This may be compensated by initially providing the pliable stamp layer 120 with features 122 that have larger than intended dimensions, such that the features 122 shrink to their intended dimensions during the solidification of the precursor material layer 130.

Upon solidification of the solidification of the precursor material layer 130 to form the support layer 140, a rigid carrier 160 may be formed on the support layer 140, as shown in step (e). Such a rigid carrier 160 may be made of any suitable rigid material, e.g. glass. The rigid carrier 160 preferably is made of a material that is thermally matched to the material of a substrate to be patterned by the stamp, i.e. has similar or identical thermal expansion coefficients therewith, such that changes in temperature during the imprinting process do not affect the alignment of the stamp with the surface receiving its pattern. The support layer 140 may be affixed to the rigid carrier 160 in any suitable manner, e.g. through grafting or through adhesion using an adhesive. In an embodiment, the precursor material layer 130 is converted into the support layer 140 in the presence of the rigid carrier 160, such that the rigid carrier 160 is directly grafted onto the patterned stamp. This for instance aids to prevent deformation, e.g. shrinkage, of the stamp in the X-Y plane, i.e. the major plane of the contoured surface 10. This further improves the robustness and accuracy of a subsequent imprinting process in which the patterned stamp is used.

The resultant structure may subsequently be released from the contoured surface 10 to yield a patterned stamp 100 having a stamp layer 120 comprising a stamp surface carrying a pattern of features 122, which stamp surface matches the surface profile of the contoured surface 10, wherein the structural integrity of the stamp 100 is provided by the support layer 140 and optionally by the rigid carrier 160. In other words, the contoured stamp layer 120 comprises a stamp surface that is the inverse of the patterned contoured surface to be formed.

In an embodiment, the patterned stamp 100 has an elastomeric or rubber body including stamp layer 120 that is made of the same material as the support layer 140, e.g. soft PDMS. In an alternative embodiment, the patterned stamp 100 has a stamp layer 120 that is made of a different material than the support layer 140, e.g. a soft PDMS support layer 140 and a hard PDMS or X-PDMS stamp layer 120 as previously explained. More generally, the patterned stamp 100 may have an elastomeric or rubber body including a stamp layer 120 of an elastomeric or rubbery material having the same or a higher Young's modulus as the elastomeric or rubbery material of the support layer 140, as previously explained. It should be understood that it is desirable to use a material for the pliable stamp layer 120 with a Young's modulus that is as low as possible to ensure an easy release of the patterned stamp 100 from a layer imprinted by the patterned stamp 100 to maximize the lifetime of the patterned stamp 100.

It is noted for the avoidance of doubt that embodiments of the present invention are directed to any patterned stamp 100 that has a contoured printing surface carrying a pattern of features 122, and that is obtainable by embodiments of the stamp manufacturing method of the present invention.

Figure 3:
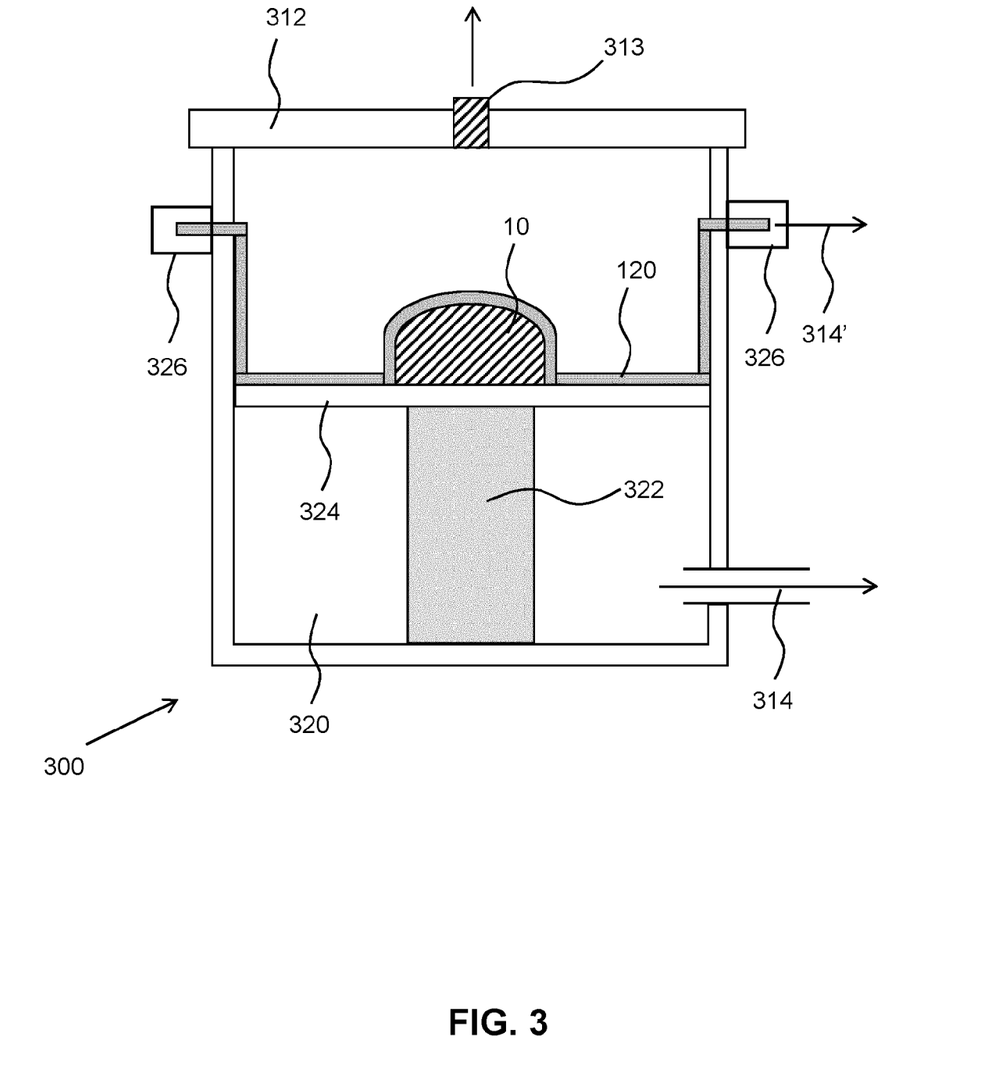
FIG. 3 schematically depicts a vacuum chamber for use in the stamp manufacturing method of FIG. 2.

FIG. 3 schematically depicts a cross-section of an example embodiment of a vacuum chamber 300 in which the patterned pliable stamp layer 120 may be forced onto the contoured surface 10 under reduced pressure as previously explained. The vacuum chamber 300 comprises a housing 310 and a lid 312 that may be affixed to the housing 310 in any suitable manner, e.g. using clamps. The lid 312 may comprise an opening for exposing the top surface of the pliable stamp layer 120 such that the fluid precursor material 130 can be deposited, e.g. poured, onto the pliable stamp layer 120 as previously explained. In FIG. 3, this opening is sealed by a removable sealing member 313, e.g. a rubber stopper, as is well-known per se. A vacuum connector 314 extends through the housing 310 to connect the inner volume 320 of the vacuum chamber 300 to a vacuum pump (not shown). It is noted for the avoidance of doubt that at least in some embodiments the vacuum pump does not form part of the vacuum chamber 300. The vacuum chamber 300 may further comprise one or more spacers 322 for carrying a sample holder 324. The sample holder 324 may define a liquid container in cooperation with the side walls of the vacuum chamber 300 or may be an integral liquid container in its own right. As previously explained, the sample holder 324 may act as a container for the fluid precursor material 130.

In an embodiment, the patterned pliable stamp layer 120 may extend over the sidewalls of the container and through a recess in the sidewalls of the vacuum chamber 300 into a clamp 326, which clamp 326 may also be connected to the vacuum pump as indicated by arrow 314'. A plurality of clamps 326, e.g. a pair of clamps 326 may be provided to secure the patterned pliable stamp layer 120 in the vacuum chamber 300, or on the sample holder 324 to be more precise.

In an embodiment, the portions of the patterned pliable stamp layer 120 that are not intended to contact the contoured surface 10, e.g. the portions of the patterned pliable stamp layer 120 extending over the sidewalls of the liquid container and into the clamps 326, may not carry a pattern of features 122 over the full length of these portions, or may not carry a pattern of features 122 on these portions at all.

It should however be understood that alternative embodiments, e.g. an embodiment in which the patterned pliable stamp layer 120 does not extend over the sidewalls of the liquid container but is intended to contact the contoured surface 10 only may also be contemplated.

In operation, a vacuum may be applied to the vacuum chamber 310 via the vacuum connector 314 such that the patterned pliable stamp layer 120 is sucked onto the contoured surface 10 and onto the sidewalls of the liquid container including the sample holder 324. The vacuum is typically applied for a long enough period to ensure an intimate fit between the patterned pliable stamp layer 120 and the contoured surface 10, after which the deposition of the precursor material layer 130 on the pliable stamp layer 120 may take place through the opening in the lid 312, followed by the solidification of the fluid precursor material 130 as previously explained.

It is noted that in case the patterned stamp 100 is formed in a process in which the patterned pliable stamp layer 120 extends over the sidewalls of the liquid container as shown in FIG. 3, the patterned stamp 100 may additionally comprise sidewalls that are of a different material than the support layer 140. The sidewalls are typically of the same material as the patterned pliable stamp layer 120. The patterned stamp 100 may for instance comprise a soft PDMS support layer 140 and a hard PDMS or X-PDMS stamp layer 120 and sidewalls as previously explained. More generally, the patterned stamp 100 may have a stamp layer 120 and sidewalls of an elastomeric or rubbery material having the same or a higher Young's modulus as the elastomeric or rubbery material of the support layer 140, as previously explained.

The stamp 100 may be used in imprinting processes such as soft lithography imprinting processes in which an ink, e.g. a resist layer, on a surface to be patterned is imprinted with a patterned stamp to transfer the stamp pattern into the ink or resist layer. This allows for the formation of patterns having nanoscale feature sizes on such surfaces, as is known per se.

Figure 4:
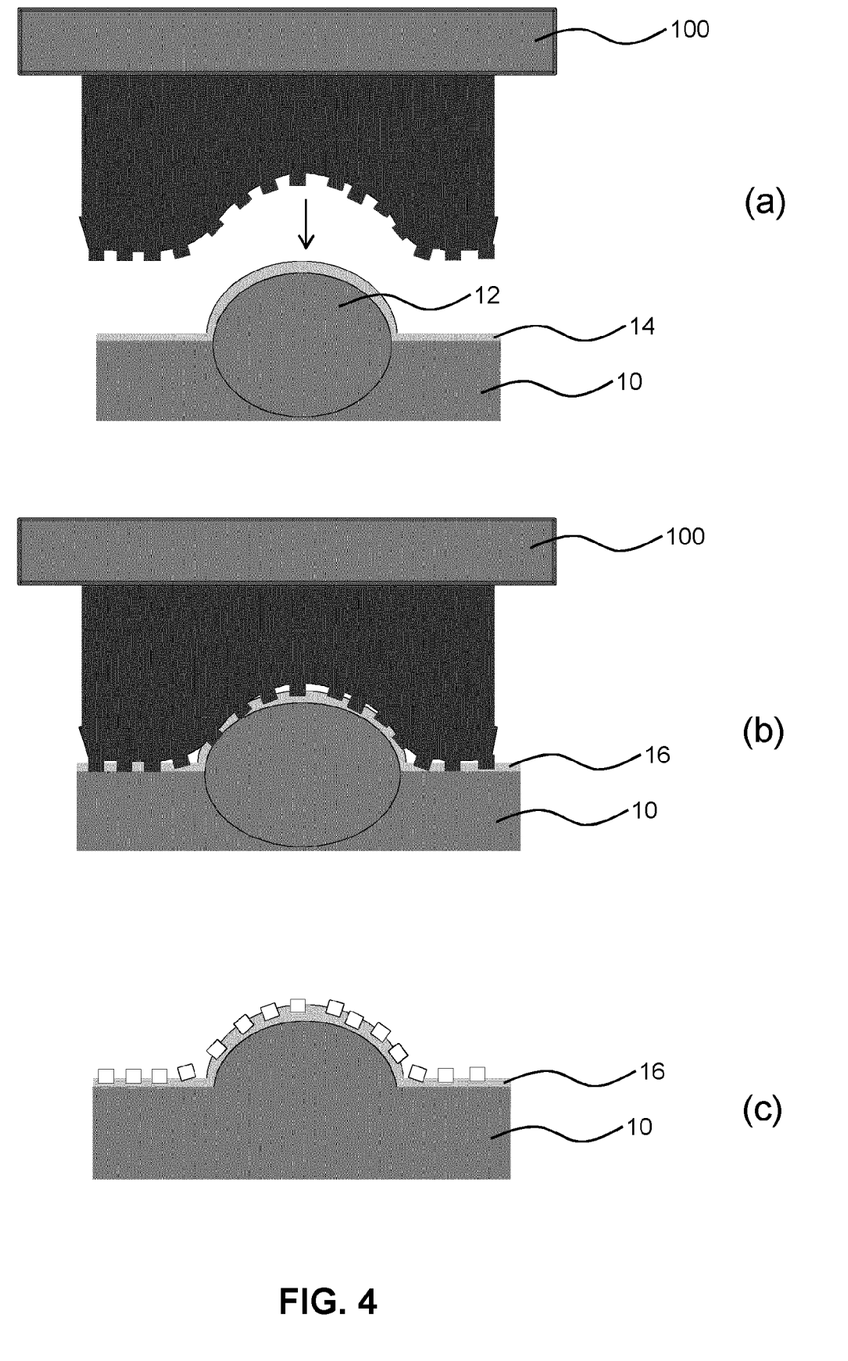
FIG. 4 schematically depicts an imprinting method according to an embodiment of the present invention.

An example embodiment of an imprinting method in accordance with the present invention is shown in FIG. 4. In step (a), a receiving surface 10 comprising one or more contours 12 is provided together with an embodiment of the patterned stamp 100 of the present invention. An ink or resist precursor layer 14 to be imprinted by the patterned stamp 100 is provided on the contoured surface 10. The ink or resist precursor layer 14 may be any suitable material, e.g. an organic or inorganic resist precursor material. As such materials are well-known per se and widely documented, a further description of the compositions of such materials is omitted for the sake of brevity only. Similarly, the material used for the contoured surface 10 is not particularly limited. Any suitable material may be used for the contoured surface as previously explained. It is noted that the contoured surface 10 to be imprinted shown in FIG. 4 is identical to the contoured surface 10 shown in FIG. 2 to form the patterned stamp 100, thereby ensuring that the contoured surface of the patterned stamp 100 precisely matches the shape of the contoured surface 10 upon correct alignment, including the boundary regions of the contours 12 as previously explained in more detail.

In step (b), the ink or resist layer 14 is imprinted with the patterned stamp 100 and subsequently developed, e.g.

solidified through a curing reaction, to form the patterned ink or resist layer 16 on the contoured surface 10, after which the patterned stamp 100 is removed in step (c) to yield an article comprising a contoured surface 10 carrying a patterned ink or resist layer 16. As previously explained, such an article benefits from the fact the pattern on the contoured surface 10 is continuous, i.e. also present in the boundary regions of the contours 12, thus providing a contoured surface pattern of high quality.

Figure 5:
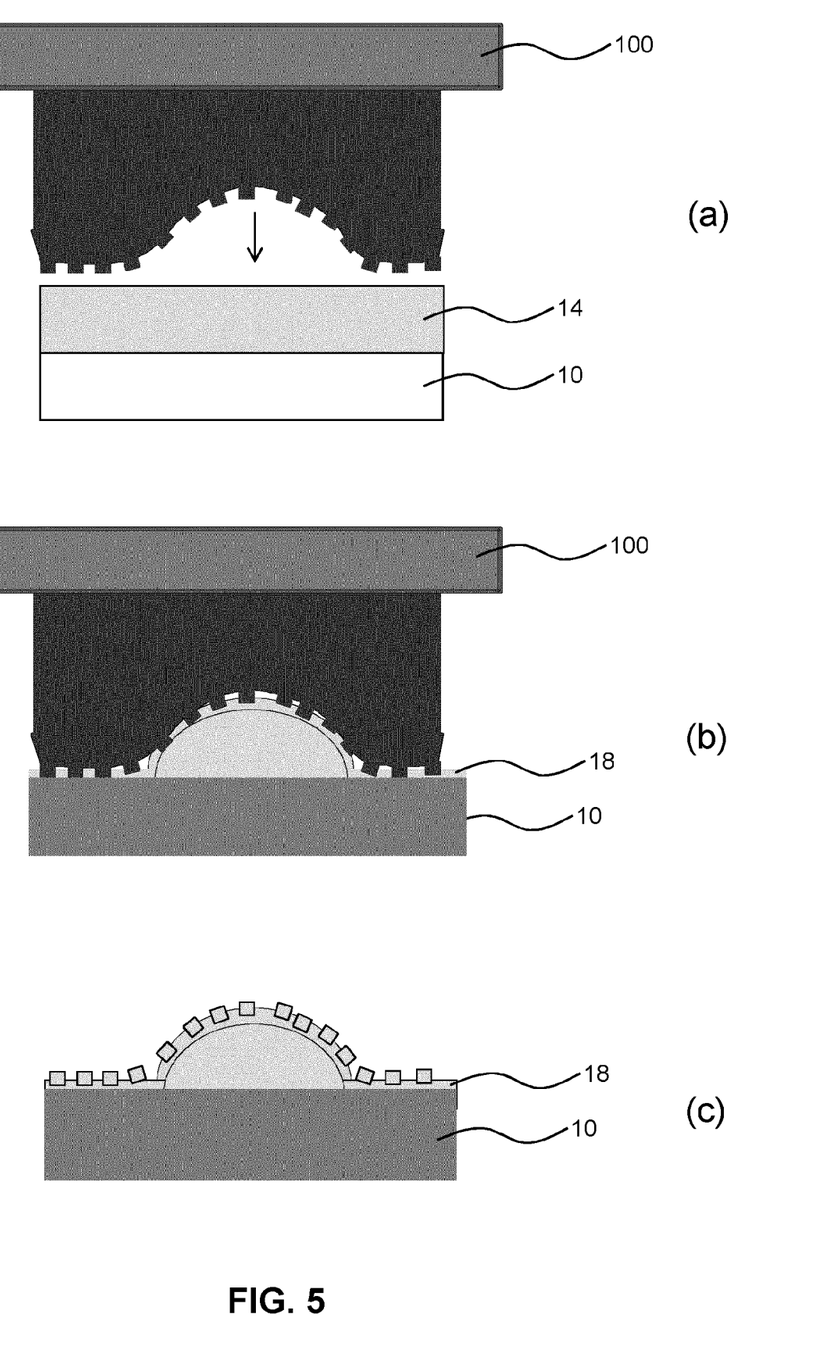
FIG. 5 schematically depicts an imprinting method according to another embodiment of the present invention.

At this point it is noted that the imprinting method of the present invention is not limited to imprinting contoured surfaces only. An alternative embodiment is shown in FIG. 5, in which the patterned stamp 100 is used to form contours on a planar receiving surface 10. To this end, a relatively thick (viscous) ink or resist precursor layer 14 is applied on the surface 10 in step (a), after which the ink or resist precursor layer 14 is imprinted with the patterned stamp 100 and subsequently developed in step (b) to yield a patterned ink or resist layer 18 after removal of the patterned stamp 100 in step (c). The patterned ink or resist layer 18 includes the contours 12 shown in FIGS. 2 and 4, i.e. the contours 12 do not form an integral part of the substrate comprising the planar surface 10 but instead are formed as part of the developed patterned ink or resist layer 18.

It is noted that the contours 12 forming part of the developed patterned ink or resist layer 18 are more susceptible to shrinkage than when the contours 12 form an integral part of the contoured surface 10. Also, it will be apparent that more ink or resist material 14 is required in the method of FIG. 5. However, in the imprinting method of FIG. 4, the patterned stamp 100 must be carefully aligned with the contoured surface 10 to achieve a high-quality transfer of the pattern of features 122 to the contoured surface 10, whereas in the method of FIG. 5 such alignment requirements are much more relaxed since the contoured surface of the patterned stamp 100 does not match the shape of the planar surface 10.

At this point, it is noted that the imprinting steps (b) in FIGS. 4 and 5 may be performed under reduced pressure, e.g. in a vacuum chamber such as the vacuum chamber 300 to further improve the contact between the patterned stamp 100 and the (contoured) surface 10.

The method as shown in FIG. 4, i.e. the formation of the feature pattern on an already contoured surface may be useful if the contours have relatively large dimensions, e.g. dimensions of 100 microns to several centimeters and beyond. The method shown in FIG. 5 may be less suitable to form patterned contoured surfaces with such dimensions as the amount of shrinkage of the contours 12 formed from the resist material 18 may prohibit the accurate reproduction of the desired contoured surface 10. However, for smaller contour sizes, e.g. contour sizes in the range of 1-100 micron, the method shown in FIG. 5 can be used to accurately reproduce the desired contoured surfaces because of the modest amount of shrinkage of the contours 12 formed from the resist material 18.

At this point, it is noted that the size of the contours in the printing surface of patterned stamp 100 is not particularly limited. The contours may have dimensions ranging from about 1 micron to dimensions in the centimeter range, e.g. 1 cm or beyond. Moreover, the ratio defined by the dimensions of the contours in the printing surface of patterned stamp 100 divided by the dimensions of the features 122 is not particularly limited and may range from as little as 2 to as much as 1,000,000,000, e.g. from 5-100,000,000 or from 50-50,000,000. In other words, nanometer-sized features may be imprinted onto contoured surfaces having contour dimensions of several centimeters up to a meter.

Figure 6:
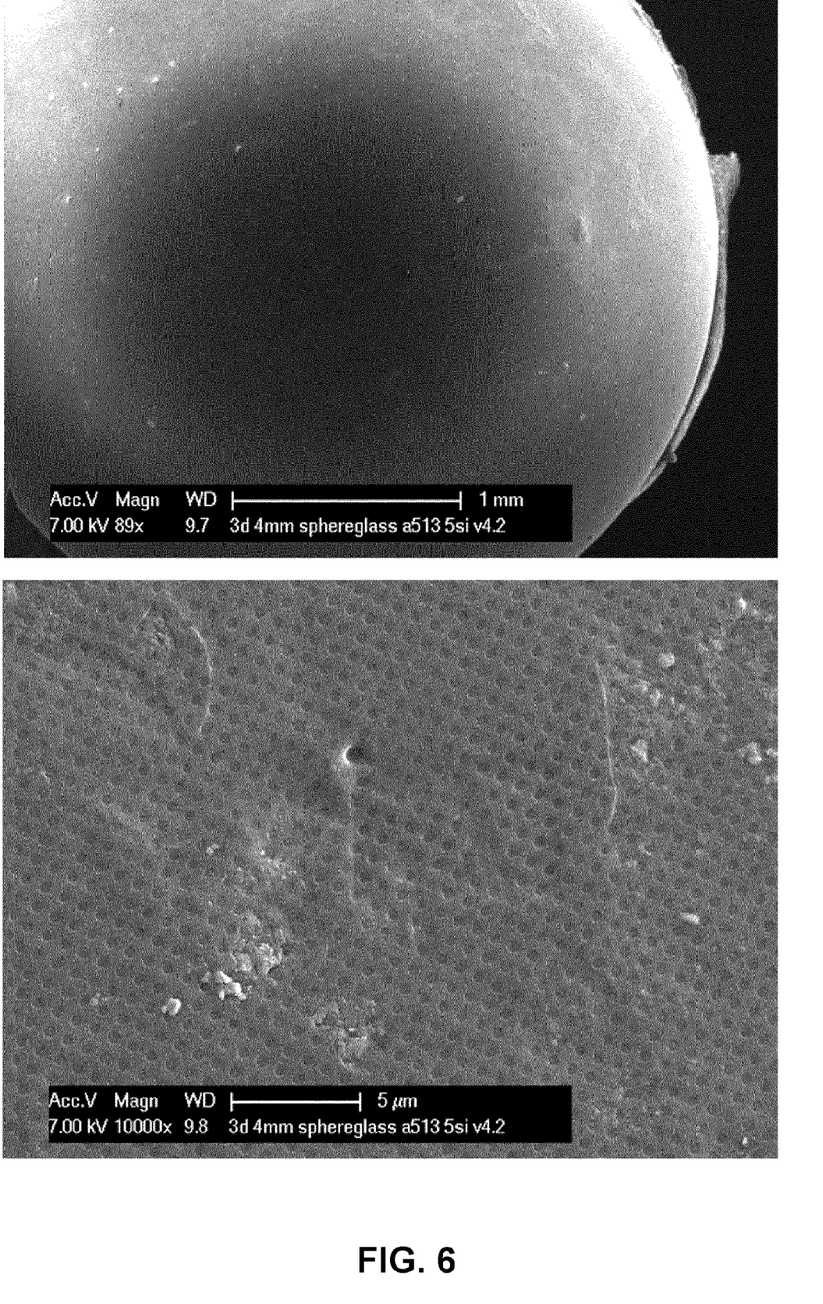
FIG. 6 shows SEM photos of an article imprinted in accordance with the imprinting method of FIG. 4.

FIG. 6 shows a pair of SEM images of a glass sphere having a 4 mm diameter that has been imprinted in accordance with the imprinting method of FIG. 4 using a patterned stamp 100 formed in accordance with the method shown in FIG. 2, in which an identical glass sphere was used as the contoured surface 10. The top image shows the resultant structure at 89× magnification and the bottom image shows the resultant structure at 10,000× magnification. It can be readily recognized in FIG. 6 that a regular pattern has been produced on the glass sphere with negligible defects. The debris that can be recognized on the glass sphere in the bottom image is contamination of the patterned surface of the glass sphere that is unrelated to the imprinting method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a patterned stamp for patterning a contoured surface, the method comprising:
providing a pliable stamp layer carrying a pattern of relief features;
forcing the pliable stamp layer onto the contoured surface with said pattern of relief features facing the contoured surface;
applying a fluid support layer over the pliable stamp layer on the contoured surface;
solidifying the support layer to form the patterned stamp; and
removing the patterned stamp from the contoured surface.

2. The method of claim 1, wherein forcing the pliable stamp layer onto the contoured surface comprises:
placing the contoured surface with the pliable stamp layer in a vacuum chamber; and
reducing the pressure in said vacuum chamber to force the pliable stamp layer onto the contoured surface.

3. The method of claim 1, wherein solidifying comprises grafting the support layer onto the pliable stamp layer.

4. The method of claim 3, wherein the pliable stamp layer and the support layer comprise a rubbery material.

5. The method of claim 4, wherein the rubbery material is a siloxane-based material such as polydimethylsiloxane.

6. The method of claim 1, wherein the relief features have a larger than intended dimensions, the relief features shrinking to the intended dimensions during solidifying.

7. The method of claim 1, further comprising applying a soft layer onto the contoured surface, wherein forcing the pliable stamp layer onto the contoured surface comprises forcing the relief features into the soft layer.

8. The method of claim 1, wherein the pliable stamp layer comprises a distorted pattern of features, and wherein forcing the patterned pliable stamp layer onto the contoured surface comprises deforming the distorted pattern into an intended pattern.

9. The method of claim 1, further comprising fixating the patterned stamp on a rigid carrier.

\* \* \* \* \*